United States Patent [19]

Kannam

[11] 4,071,852
[45] Jan. 31, 1978

[54] TRANSISTOR HAVING IMPROVED JUNCTION BREAKDOWN PROTECTION INTEGRATED THEREIN

[75] Inventor: Peter Joseph Kannam, Princeton, N.J.

[73] Assignee: RCA Corporation, New York, N.Y.

[21] Appl. No.: 758,185

[22] Filed: Jan. 10, 1977

Related U.S. Application Data

[63] Continuation of Ser. No. 593,017, July 3, 1975, abandoned.

[51] Int. Cl.[2] .............................................. H01L 29/90
[52] U.S. Cl. ....................................... 357/13; 357/34; 357/52; 357/89; 357/90
[58] Field of Search .................... 357/13, 52, 34, 89, 357/90

[56] References Cited

U.S. PATENT DOCUMENTS

| 3,338,758 | 8/1967 | Tremere | 357/52 |
| 3,551,760 | 12/1970 | Tokuyama et al. | 357/52 |
| 3,714,526 | 1/1973 | Low et al. | 357/13 |

FOREIGN PATENT DOCUMENTS

1,453,086  9/1966  France ................................. 357/52

OTHER PUBLICATIONS

R. Warner et al., "Integrated Circuits-Design Principles and Fabrication," McGraw-Hill Book Co., © 1965, pp. 65-67.

*Primary Examiner*—Stanley D. Miller, Jr.
*Assistant Examiner*—Joseph E. Clawson, Jr.
*Attorney, Agent, or Firm*—H. Christoffersen; R. P. Williams; R. A. Hays

[57] ABSTRACT

An improved integrated transistor device has reverse bias breakdown protection for the base-collector junction. The base-collector junction is protected by means of a diode region providing a punchthrough protective mode of operation. The configuration disclosed provides a device which has comparatively stable and relatively high energy junctions therein.

3 Claims, 2 Drawing Figures

TRANSISTOR HAVING IMPROVED JUNCTION BREAKDOWN PROTECTION INTEGRATED THEREIN

This is a continuation of application Ser. No. 593,017, filed July 3, 1975, now abandoned.

The present invention relates to semiconductor devices in general, and particularly to transistors having protection against excessive reverse bias voltages.

Transistors may be severely damaged, if not catastrophically destroyed, by the application of an excessive reverse bias voltage across the base-collector junction. This is particularly true when the transistor is switched while inductively loaded. That is, when the voltage to the load goes to zero, the current stored therein flows into the transistor. This stored current can cause relatively high reverse bias voltages across the base-collector junction.

One solution to this problem has been described in U.S. Pat. No. 3,758,831 issued to Lowell E. Clark on Sept. 11, 1973. Therein, destructive avalanche breakdown is avoided by providing the transistor with an auxiliary emitter which is shorted to the base region by a base contact. Under reverse bias conditions, the base-collector junction depletes into the auxiliary emitter region, thus giving rise to a punchthrough condition in which current flows from the collector region through the auxiliary emitter, through the base contact, and into the base region. The auxiliary emitter is designed such that punchthrough occurs prior to any avalanche breakdown of the collector-junction, thereby preventing damage to this junction.

One particular problem in a device employing the solution described is that the junction between the auxiliary emitter and the base region tends to be somewhat unstable. During the formation of the base contact, it is a distinct possibility that the metal electrode may spike down through the junction into a portion of the base region therebelow. Spiking can also occur during the operation of a completed device and thereby cause the device to fail. The likelihood of spiking of the metal electrode is enhanced as the device operating temperature is increased. When spiking occurs, the portion of the base region which is disrupted thereby does not operate in a predictable manner. Thus the operation of the transistor is unreliable.

IN THE DRAWING

Figure 1:
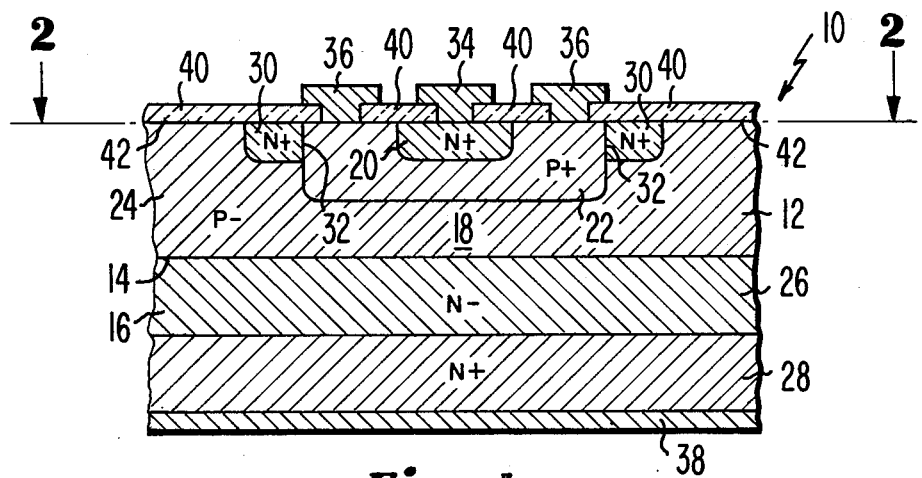
FIG. 1 is a partial cross-sectional view of the present device, not drawn to scale.
Figure 2:
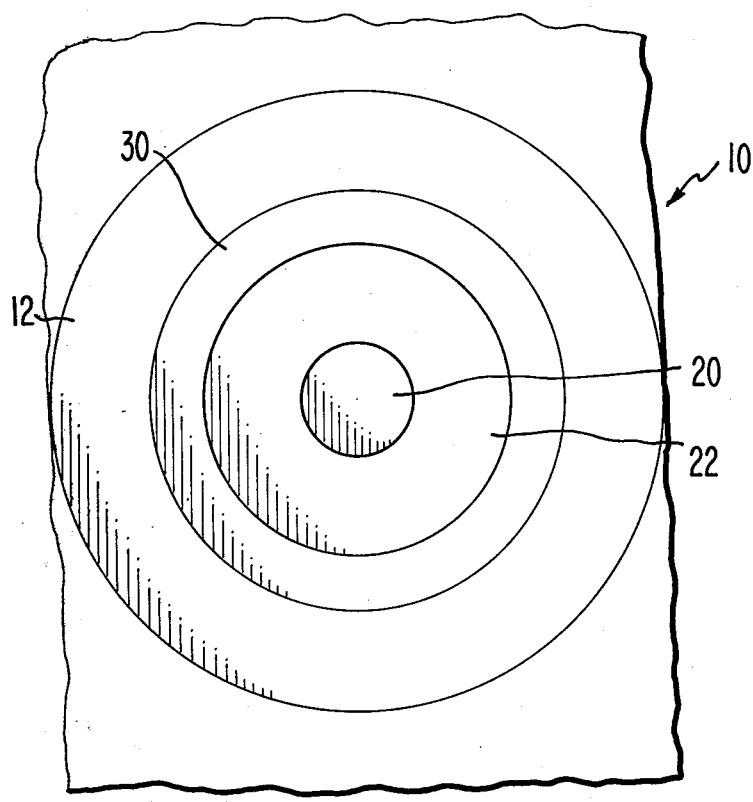
FIG. 2 is a sectional view of the device shown in FIG. 1 taken along line 2—2 of FIG. 1.

The present device, indicated generally at 10 in the FIGURES comprises a body 12 of semiconductor material for example, silicon, in which is disposed a transistor and means for protecting the base-collector junction 14 thereof against damage caused by relatively high reverse bias voltages.

The transistor 10 comprises a collector region 16 of, for example N type conductivity, a base region 18 of P type conductivity, and an emitter region 20 of N type conductivity. For reasons described hereinafter, the base region 18 comprises a first portion 22 of comparatively low average resistivity, for example, 0.03 ohm-cm, and a second portion 24 of comparatively high average resistivity, for example 30 ohm-cm. The first portion 22 encompasses the emitter region 20. The first portion 22 is substantially completely within the second portion 24. Also, for reasons known in the transistor art, the collector region 16 comprises a first layer 26 of comparatively high average resistivity, for example 30 ohm-cm, and a second layer 28 of comparatively low average resistivity, for example 0.01 ohm-cm. By virtue of the relatively high average resistivities of the second portion 24 and the first layer 26 adjoining the junction 14 between the collector region 16 and the base region 18, the avalanche breakdown voltage of the junction 14 is relatively high, for example on the order of about 700 volts.

Base-collector junction protection means comprises a protective region 30 of comparatively low N type average resistivity material, for example 0.003 ohm-cm, contacting and substantially surrounding the first portion 22 of the base region 18 and forming a PN junction 32 therewith. The protective region 30 is within the base region 18 and spaced apart from the collector region 16. For reasons of ease of fabrication, the conductivity profile and depth of the protective region 30 can be the same as those of the emitter region 20, whereby both of these regions can be formed simultaneously in a single diffusion step. It should be noted, as indicated by the above reference to a diffusion step, that the protective region is a doped region and not a field induced region. The conductivity profile and the depth of the protective region 30 however are not critical so long as the protective region 30 remains spaced apart from the collector region 16.

Electrodes for the device 10 comprise an emitter electrode 34 contacting the emitter region 20, a base electrode 36 contacting the low average resistivity first portion 22 of the base region 18, and a collector electrode 38 contacting the collector region 16. The protective region 30 is not directly contacted by any electrode and is allowed to "float". That is, the protective region 30 takes on the voltage potential of the region surrounding it. As shown, and in accordance with conventional practices, an insulating layer 40, for example silicon dioxide, or the like, is provided on a surface 42 of the body 12 to protect it and prevent shorting of the various PN junctions by the electrodes where the PN junctions intercept the surface 42.

The device 10 can be fabricated by methods known in the art.

The operation of the device 10 is as follows. The base-collector junction 14, under reverse bias voltage conditions, forms a depletion region which extends into the second portion 24 of the base region 18 and the first layer 26 of the collector region 16. If the electric field at the junction 14 becomes excessively high, destructive avalanching can occur. For reasons known in the semiconductor art, a PN junction, having a given reverse bias voltage thereacross, depletes further into a semiconductor material having a comparatively higher resistivity than into material having a comprarately lower resistivity. In the instant device, the second portion 24 is designed with a suitably high resistivity that the depletion region reaches, i.e., punches-through to the protective region 30 prior to the avalanching of the junction 14. The reverse bias voltage across the base-collector junction 14 is thus impressed across the PN junction 32 between the protective region 30 and the first portion 22 of the base region 18. Since the junction 32, because of the comparatively low resistivities of the first portion 22 and the protective region 30, has a relatively low breakdown voltage, designed to considerably less than the collector voltage which is thus applied thereacross, it avalanches substantially immediately upon the depletion region reaching the protective region 30. Additionally, because of the surrounding relationship of the protective region 30 with the first portion 22 of the base region 18, the PN junction 32 breaks down substantially simultaneously around the first portion 22 of the base region 18. Thereupon current flows in a substantially equally distributed manner into the emitter region 20, thereby avoiding hot spot formation caused by current crowding and the resulting damage thereof to the device 10. By virtue of the relatively low breakdown voltage of the junction 32 and the surrounding relationship with the first portion 22 of the base region 18 the avalanche breakdown is nondestructive of the device 10. Various parameters, such as the conductivity profile and depth of the protective region 30, the conductivity profile and depth of the first portion 22 of the base region 18, can be adjusted using known process techniques to insure that punchthrough to the protective region 30 and avalanche breakdown of the PN junction 32 occur prior to that of the base-collector junction 14.

The device 10, as described above, avoids the use of a short between the first portion 22 of the base region 18 and the protective region 30, thus the PN junction 32 therebetween is quite reliable even for periods of prolonged operation. The fact that the current, when the junction 32 breaks down, is substantially equally distributed into the emitter adds to the reliability of the device 10. Hence the device 10 is capable of sustaining high energy transients such as those found, for example, in automotive ignition systems, thereby eliminating the need for externally connected diodes presently found in conventional systems.

What is claimed is:

1. An improved semiconductor device of the type having a collector region of one type conductivity and a base region of a second type conductivity forming a base-collector PN junction therewith, said base region comprising a first portion having a comparatively low average resistivity and a second portion having a comparatively high average resistivity, an emitter region of said one type conductivity within said first portion, and a doped protective region of said one type conductivity adjacent said base region and forming a second PN junction therewith, said protective region being spaced apart from said collector region, wherein the improvement comprises:

said doped protective region substantially surrounding said first portion and being unconnected directly to any electrode of said device so that it 'floats' with respect to voltage potentials applied across said device; and a base electrode contacting said first portion of said base region.

2. An improved semiconductor device as claimed in claim 1 wherein:

said second PN junction has a comparatively lower avalanche breakdown voltage than said base-collector PN junction.

3. An improved semiconductor device as claimed in claim 1 wherein:

said emitter region and said doped protective region have substantially the same conductivity profile and depth.

* * * * *